(12) United States Patent
Ignjatovic

(10) Patent No.: US 11,394,391 B2
(45) Date of Patent: Jul. 19, 2022

(54) ANALOG-TO-DIGITAL CONVERTERS EMPLOYING CONTINUOUS-TIME CHAOTIC INTERNAL CIRCUITS TO MAXIMIZE RESOLUTION-BANDWIDTH PRODUCT—CT TURBOADC

(71) Applicant: Zeljko Ignjatovic, Rochester, NY (US)

(72) Inventor: Zeljko Ignjatovic, Rochester, NY (US)

( * ) Notice: Subject to any disclaimer, the term of this patent is extended or adjusted under 35 U.S.C. 154(b) by 103 days.

(21) Appl. No.: 17/062,605

(22) Filed: Oct. 4, 2020

(65) Prior Publication Data
US 2021/0021274 A1    Jan. 21, 2021

Related U.S. Application Data

(60) Provisional application No. 62/739,891, filed on Oct. 2, 2018.

(51) Int. Cl.
| | |
|---|---|
| *H03M 1/06* | (2006.01) |
| *H03M 1/20* | (2006.01) |
| *G06N 3/04* | (2006.01) |
| *H03M 1/50* | (2006.01) |

(52) U.S. Cl.
CPC ........ *H03M 1/0636* (2013.01); *G06N 3/0418* (2013.01); *G06N 3/0454* (2013.01); *H03M 1/201* (2013.01); *H03M 1/508* (2013.01)

(58) Field of Classification Search
CPC .... H03M 1/06; H03M 1/20; H03M 1/500636; H03M 1/201; H03M 1/508; H03M 1/144; H03M 1/1235; H03M 3/458; G06N 3/0418; G06N 3/0454; G06N 3/0445
USPC .................................................. 341/130–155
See application file for complete search history.

(56) References Cited

U.S. PATENT DOCUMENTS

| | | | | |
|---|---|---|---|---|
| 2014/0368368 | A1* | 12/2014 | Koli ...................... | H03M 3/436 |
| | | | | 341/143 |
| 2017/0077937 | A1* | 3/2017 | Shu ...................... | H03M 1/0673 |
| 2021/0159906 | A1* | 5/2021 | Singh .................... | H03M 3/422 |
| 2021/0314000 | A1* | 10/2021 | Ippolito ................ | H03M 3/464 |

\* cited by examiner

*Primary Examiner* — Lam T Mai

(57) ABSTRACT

An analog-to-digital conversion devices and methods that approach a linear relationship between resolution and over-sampling rate. The process involves modulating an input analog signals with an essentially chaotic encoding signal that is deterministic, aperiodic in that it lacks spectral tones above a threshold, and bounded. The resulting encoded signal is quantized into a bit stream and decoded by applying to that bit stream a non-linear estimation related to said chaotic signal to thereby produce an output representing said input analog signal in digital form.

7 Claims, 3 Drawing Sheets

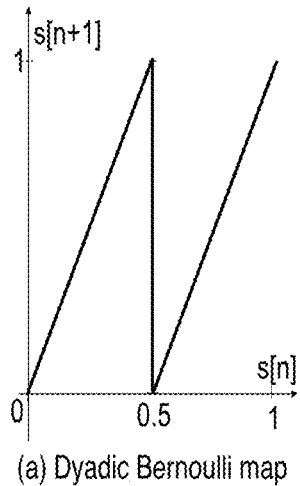
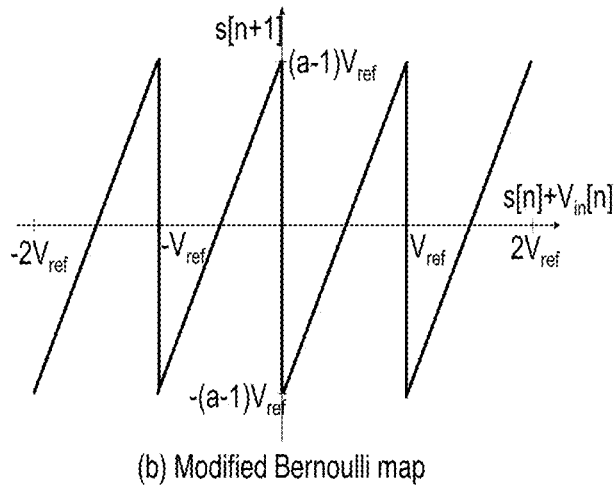
Fig. 3(a)　　　　　　　Fig. 3(b)
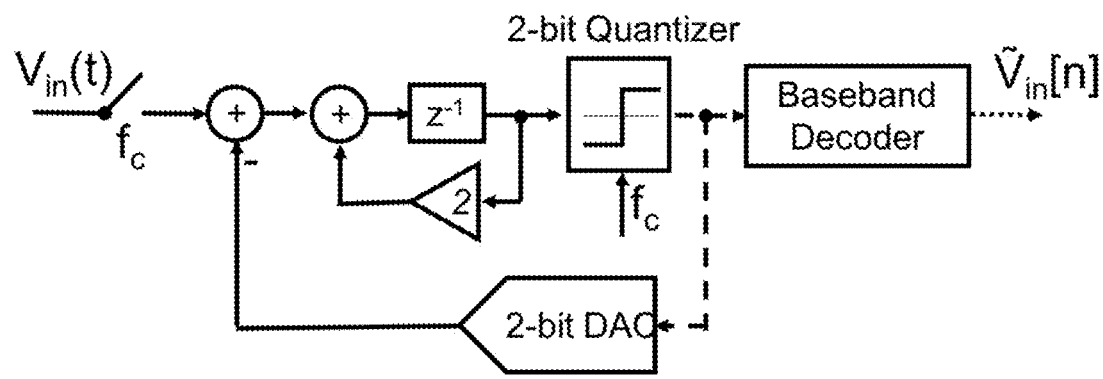
Fig. 4 (PRIOR ART)

ANALOG-TO-DIGITAL CONVERTERS EMPLOYING CONTINUOUS-TIME CHAOTIC INTERNAL CIRCUITS TO MAXIMIZE RESOLUTION-BANDWIDTH PRODUCT—CT TURBOADC

CROSS-REFERENCE TO PRIOR APPLICATIONS

The patent application claims the priority to and incorporates by reference the entire content of provisional application 62/739,891 filed Oct. 4, 2019.

TECHNICAL FIELD

This patent application pertains to apparatuses and methods for analog-to-digital conversion of electrical signals, and more particularly, to apparatuses and methods for performing a high-speed and high-resolution conversion of analog electrical signals to digital format.

BACKGROUND

Much if not most real-world information originates in analog form and must be converted to digital for processing and use. Analog-to-digital converters (ADC) and conversion methods have experienced rapid growth in recent decades due to the steady development of CMOS technologies and the increasing demand for higher resolution and bandwidth. See the references that are listed at the end of the Detailed Description portion of this patent application and are identified by reference numeral in square brackets in the discussion below. All are incorporated by reference in this patent specification. CMOS technologies have allowed more systems (both analog and digital) to be integrated into a single chip, thus reducing manufacturing costs and allowing additional functions such as calibration techniques.

There are two mainstream ADC techniques: Nyquist rate ADCs (e.g., Flash, Single-slope, Dual-slope, SAR, and Cyclic) and oversampling ADCs (e.g., oversampling PCM and $\Delta\Sigma$ converters). Nyquist rate ADCs are commonly used for low-to-moderate precision (resolution) and high bandwidth conversion applications, as seen in FIG. 1. Their resolution is limited by two fundamental sources of noise, thermal and flicker noise, as well as circuit imperfections such as DC offsets and non-linearity. $\Delta\Sigma$ ADCs are used for high-precision low-to-moderate bandwidth applications. Their bandwidth is limited by the oversampling demands and the precision is limited by circuit noise and to a lesser extent by non-idealities such as DC offset, gain error, and non-linearity. In addition, $\Delta\Sigma$ ADCs are prone to instability due to the presence of a non-linear comparison operation within a feedback loop, which limits the order of $\Delta\Sigma$ ADCs in practical implementations. An overview $\Delta\Sigma$ ADC principles and state-of-the-art is provided in [9]-[11]. More recently, novel ADC methods have been introduced that rely heavily on joint-processing of digital samples to increase the RBW and decrease the complexity of analog components [4]-[8]. However, no single ADC method is known to be able to cover the full breath of potential applications (starting from low-power conversions for bio-sensing and IoT applications to high-speed direct RF conversion in radar and communications).

The many known types of ADCs employ different trade-offs of speed, cost, resolution, and other properties. A typical characteristic they share is that cost and complexity increase nearly exponentially with an increase of a property such as conversion speed or resolution.

A surprising result described in [12] is the discovery that the limiting resolution of an ADC can be proportional to the oversampling-ratio (OSR), as opposed to widely-held beliefs that the resolution is proportional to $\log_2(OSR)$, a dramatic increase in the achievable resolution. This result, which resembles Shannon's result for the capacity of a communication channel, represents a paradigm shift in understanding of data conversion methods and provides encouragement that new methods may be found. To achieve this theoretical limit, the internal analog modulator (or filter) of an ADC should be a chaotic system, so that small as well as large changes in the input signal cause large (but bounded) deterministic changes at the output of the modulator—in some ways similar to the "Butterfly effect".

SUMMARY

The present invention provides a new class of ADC's, called herein continuous-time (CT) TurboADC's, that can trade off resolution for bandwidth on the fly, keeping their product equal to or at least close to the fundamental information theoretic limit. These designs impose modest requirements on the analog front-end resources and power at the expense of somewhat greater complexity in the back-end decoder. A continuous-time TurboADC described in this patent application can be conceptualized as a hybrid between a continuous-time Delta-Sigma ($\Delta\Sigma$) modulator and a Cyclic ADC, with the best features of both designs—oversampling, noise shaping, and simplicity from the Sigma-delta ADC approach and fast half-interval searching from Cyclic ADC's. In one aspect, the present invention provides an analog-to-digital converter (ADC), comprising: a port for an input analog signal; a source configured to provide a continuous-time chaotic encoding signal that is deterministic, aperiodic above a threshold, and bounded; an encoder configured to encode said input analog signal with said chaotic signal to thereby produce an encoded analog signal; a quantizing circuit configured to quantize said encoded analog signal into a bit stream; and a decoder configured to apply to said bit stream a non-linear estimation related to said chaotic signal to thereby produce an output representing said input analog signal in digital form; wherein aperiodic above a threshold refers to lacking spectral tones above a threshold. In another embodiment, the input analog signal is sampled at an oversampling rate (OSR). In one embodiment, the output signal from the CT TurboADC has a resolution R proportional to OSR and varies linearly with a bandwidth of the ADC. In another embodiment, the chaotic encoding signal is generated by a chaotic oscillator based on negative-Gm LC-tank oscillator. In another embodiment, the chaotic encoding signal is generated by a continuous-time chaotic Chua circuit. In another embodiment, the decoder producing an output representing said input analog signal in digital form is implemented as a neural-network.

BRIEF DESCRIPTION OF THE DRAWINGS

FIGS. 3(a) and 3(b) show 1-dimensional chaotic maps, where 3(a) shows a traditional Bernoulli map and FIG. 3(b) shows a modified Bernoulli map as an analog encoder, as described in [12].

FIG. 4 is a block schematic of a DT TurboADC employing modified Bernoulli chaotic map, as described in [12].

DETAILED DESCRIPTION

A synergy of two distinct fields (Information theory on one side and the principles and methods of A/D conversion on the other) has led to a mathematical framework that, among other things, helped derive fundamental theoretical limits on the resolution-bandwidth product of Analog-to-digital converters (ADC) and also helped prove essential and often unexpected results [12]. For example, it is traditionally assumed that the quantization noise in ADCs is independent of the input analog signal. As a direct consequence to this assumption, the effective number of bits (ENOB) or resolution is always proportional to $\log_2$ (OSR), where the OSR is the oversampling ratio. By using Information theory tools, it has been discovered that this assumption is fundamentally flawed, and that the quantization noise is instead fully dependent on the input analog signal because its entropy is zero given the input analog signal, so that the resolution can be instead proportional to OSR. This represents a paradigm shift in understanding A/D conversion methods and leads to novel methods of conversion. This patent specification introduces a novel class of ADC, termed Continuous-Time TurboADC (CT TurboADC), that can trade resolution and bandwidth on the fly while preserving their product constant and equal or nearly equal to the fundamental theoretical limit with minimal use of analog front-end resources and power. Thanks to their simple front-end design (as simple as the 1st order $\Delta\Sigma$ modulator) and ease of integration, the CT TurboADCs described in the patent specification can replace many traditional ADC methods and even enable new applications such as software defined radio, direct RF signal conversion in communications, radar, ultrasound, and MRI imaging systems.

Figure 1:
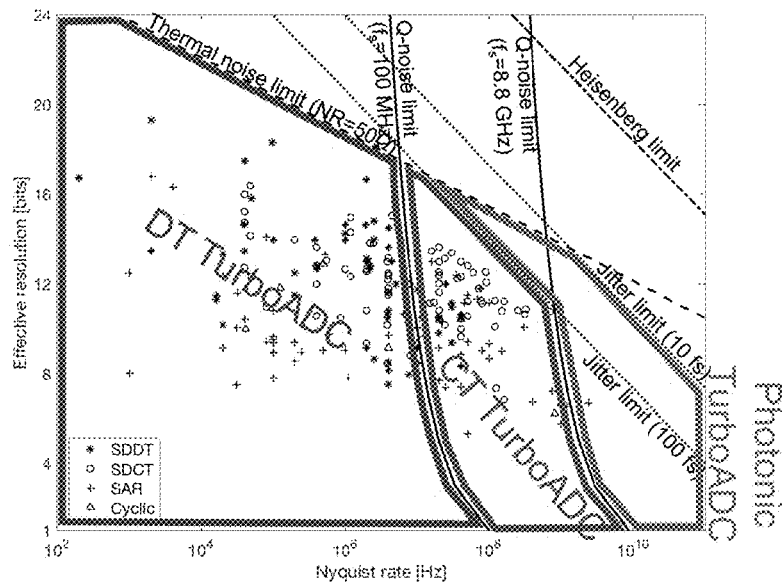
FIG. 1 illustrates TurboADC design space where data points show effective resolution vs. Nyquist rate of existing ADC methods including switched-capacitor $\Delta\Sigma$ (SDDT), continuous-time $\Delta\Sigma$ (SDCT), SAR and Cyclic ADC, assuming that the maximum sampling rate of CT TurboADC is close to 9 GHz, as in [3].

FIG. 1 illustrates a design space and how TurboADCs fit in. The data points represent effective resolution vs. bandwidth for more than 200 traditional ADC designs including Successive Approximation (SA), Cyclic, Discrete-time (SDDT) and Continuous-time (SDCT) $\Delta\Sigma$ ADC, [1]. Designs that include pipelining, time-interleaving, and other means of parallelism (such as Flash ADC) are omitted for fair comparison due to their much-increased complexity, area, and power. This figure also shows upper bounds on resolution-bandwidth (RBW) product imposed by aperture jitter (for 100 fs and 10 fs RMS jitter), thermal noise corresponding to noise equivalent resistance of 50Ω, and Heisenberg uncertainty principle as derived in [10]. It also shows upper bounds imposed by quantization noise (QN) according to our theory in [13]. Our vision is that the entire design space could be encompassed by discrete-time (DT) TurboADC for high-resolution and medium speed as described in [12], and our novel continuous-time (CT) TurboADC for high-speed conversion as described in this patent application, and finally a Photonic TurboADC for ultra-high conversion speeds in hundreds of GS/sec, as shown in FIG. 1.

Figure 2:
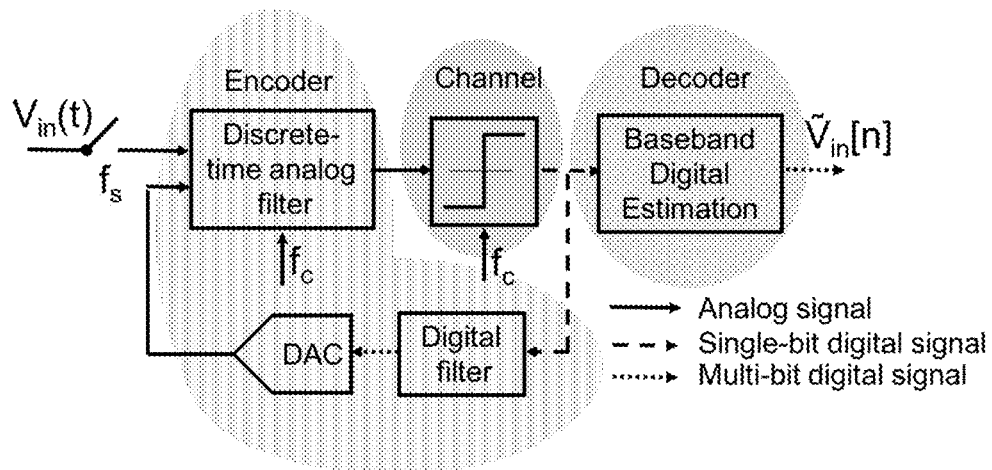
FIG. 2 illustrates an analog-to-digital converter as a communication system.

An ADC could be described as a communication system, as shown in FIG. 2. The information source is analog, meaning it provides a continuous-time and continuous amplitude signal such as voltage, current, or charge to the ADC. The analog signal is either sampled at a certain sampling rate $f_s$ and the samples $V_{in}[nT_s]$ are fed to the discrete-time analog filters and amplifiers of the ADC, or it is fed to the internal circuits of the ADC as a continuous-time signal $V_{in}(t)$ (e.g., Continuous-time $\Delta\Sigma$ ADCs). The amplifier/filter structures process the analog signal by performing a form of encoding before the signal enters the comparator, which plays the role of the 'noisy' channel. The output from the comparator generated at the rate of $f_c$ is then decoded by digital circuitry and usually fed back to the encoder. In general, the rate $f_c$ at which the comparator is operating is either equal to $f_s$ (such as in $\Delta\Sigma$ ADCs) or larger (such as in SAR and Cyclic ADCs). In fact, for almost every ADC method, a corresponding forward-error-correction (FEC) code can be found. For example, the SAR ADCs correspond to a form of block code with channel feedback. The $\Delta\Sigma$ ADCs correspond to convolutional codes, where the $\Delta\Sigma$ modulator acts as a convolutional encoder and its decimation filter plays the role of the maximum likelihood decoder. Also, the order of the $\Delta\Sigma$ modulator defines the memory length of the encoder. Describing an ADC as a communication system with FEC coding involves the assumption that the comparator(s) of an ADC is a 'channel' since it injects quantization noise into the 'transmitted' signal even if the circuit components are otherwise noiseless. Once the comparator of the ADC is described as a communication channel, its intrinsic capacity (i.e., maximum number of information bits that can be digitized per second) can be derived. Since the QN is neither Gaussian nor independent of the input signal to the comparator (in fact, the QN in an ideal ADC system is fully described given the input signal), the Shannon capacity formula $C=B*\log_2(1+SNR)$, where B is the channel bandwidth, as derived in [2], cannot be applied to calculate the capacity of such a system. A more general approach involving mutual information and entropy should be used. Some important conclusions from previous work about ADC theory are listed below in the form of theorems (for proofs see [12] and [13]).

Theorem 1. Capacity: Maximum information rate at the output of an ADC employing M comparators operated at $f_c$ comparisons per second is equal to $M*f_c$ bits per second. This maximum information rate is defined as a Conversion Capacity $C_{ADC}$.

Theorem 2. Existence: There exists at least one ADC that can operate at the $C_{ADC}$ regardless of the input signal statistics. This type of ADC is termed TurboADC with reference to Turbo codes in communications that are able to approach Shannon's channel capacity.

Theorem 3. Necessary condition: An ADC can achieve the conversion capacity if the autocorrelation function of the input to its internal comparator(s) is a delta function (i.e., white spectral properties) regardless of the input signal statistics.

Consequently, two properties of a TurboADC can be derived.

Corollary 1. The internal analog filter of a TurboADC that encodes the input signal before it is fed to the comparator, must be a non-linear filter (or a non-linear mapping).

Corollary 2. The output of the comparator in a TurboADC is a sequence of independent uniformly distributed bits.

Theorem 4. Oversampling: If an ADC operates at its capacity and the input analog signal is oversampled by a factor of OSR=$f_s/2f_{in}$, the effective resolution in the baseband is equal to OSR bits.

Perhaps the most interesting and unexpected property of a TurboADC is the one described in Theorem 4. It states that the resolution of a TurboADC is proportional to the OSR. In contrast, traditional oversampling $\Delta\Sigma$ ADC's achieve effective resolution that is proportional to $\log_2(OSR)$. Clearly, for the same resolution, a TurboADC may operate at an exponentially lower sampling rate than the $\Delta\Sigma$ ADC's. Also, from Theorem 4 flows a conclusion that resolution of a TurboADC trades linearly with its bandwidth such that the R-BW product is constant and equal to $C_{ADC}$. For example, to increase the resolution from 8 to 16 bits, a 2nd-order $\Delta\Sigma$ ADC would have to increase its sampling rate by a factor of 9.1 while a TurboADC would only have to double it (5 times reduction in power), which could prove crucial in battery-operated IoT devices. On the other hand, for the same technology node and power consumption, TurboADC may achieve data rates significantly higher than other ADC methods, which may enable new high-speed conversion applications. Finally, from Theorems 1 and 3 we prove the following theorem.

Theorem 5. Chaotic encoder: In order to achieve the theoretical limit to the R-BW product (the capacity) irrespective of the input signal statistics, the ADC's internal analog filter should be a deterministic system with aperiodic and bounded state trajectories for all input signal statistics—a chaotic system.

Proof. First, a proof of deterministic property of the analog filter (or encoder). As in [13], mutual information between the comparator's 1-bit output y[n] and the analog input $V_{in}[n]$ is defined as, $$I(V_{in}[n], y[n]) = H(y[n]|y[n-1], \ldots y[1]) - H(y[n]|y[n-1], \ldots y[1], V_{in}[n], \ldots V_{in}[1]) \quad (1)$$

Since the first term $H(y[n]|y[n-1], \ldots y[1])$ can be at most equal to 1 bit, the mutual information term is maximized if and only if the second term is equal to zero. The second term is zero if and only if the state of the encoder is fully described given the input analog signal (i.e., it is not stochastic). Second, the state boundedness can be proved by contradiction. If the state is unbounded it must grow to either positive infinite or negative infinite (not both). Otherwise, its bandwidth would grow to infinity, which cannot be the case with discrete-time systems. Therefore, if the state becomes unbounded the output from the comparator y[n] would be a constant value that carries no information (i.e., information rate falls below the capacity). Third, according to Theorem 3, since the state value over its trajectory must have a delta autocorrelation function it must follow aperiodic orbits (i.e., random-like nature). Finally, if an analog encoder is to produce an output that has white spectrum (aperiodic orbits) for any input signal statistics, it should do so even in the limiting case where the input signal is a delta function with the maximum bandwidth of $f_s/2$. In this case, the input signal affects only the initial state of the analog encoder and the subsequent state values continue to change on their own over aperiodic orbits. Therefore, it must be sensitive to initial conditions—a "Butterfly effect". An alternative limiting case, when the input analog signal is a DC signal, would lead to the same requirement about the analog encoder.

Discrete-Time TurboADC: This prior-art on a discrete-time implementation of TurboADC is described in detail in [13] and it is provided here as background information. First, a simple discrete-time dyadic transformation (or Bernoulli map) that can give rise to chaotic behavior is considered. The phase space of this simple map is shown in FIG. 3(a), which in its original form does not allow the use of an independent variable to affect the state's trajectory. There are several ways to ensure that an input analog signal is introduced into the chaotic map to affect the state's aperiodic trajectory. FIG. 3(b) depicts the phase space of a modified Bernoulli chaotic map proposed in this work. This particular map has been proposed for two reasons. First, it maximizes the dynamic range and signal-to-noise ratio (SNR) by allowing the amplitude of the input signal $V_{in}[n]$ to reach maximum level of $V_{ref}$. Second, it ensures a simple switched-capacitor circuit implementation, as shown in FIG. 4. Also, Eqs. (2a)-(2e) show the dynamical law of this chaotic system, where s[n] is the internal state of the chaotic filter and $V_{ref}$ is the reference analog voltage used by a TurboADC for digitization.

$$q[nT_s] = s[nT_s] + V_{in}[nT_s] \quad (2a)$$

$$y_0[nT_s] = \begin{cases} 1, & q[nT_s] \geq 0 \\ -1, & \text{otherwise} \end{cases} \quad (2b)$$

$$y_+[nT_s] = \begin{cases} 1, & q[nT_s] \geq V_{ref} \\ 0, & \text{otherwise} \end{cases} \quad (2c)$$

$$y_-[nT_s] = \begin{cases} -1, & q[nT_s] \leq -V_{ref} \\ 0, & \text{otherwise} \end{cases} \quad (2d)$$

$$s[(n+1)T_s] = a \cdot q[nT_s] - V_{ref}(y_0[nT_s] + 2 \cdot y_+[nT_s] + 2 \cdot y_-[nT_s]) \quad (2e)$$

The state s[n] remains bounded in the [−aVref, aVref) interval and trajectory is deterministic in absence of electronic noise. For certain values of the gain (e.g., a=2) and initial state the map exhibits a true chaotic behavior with the Lyapunov exponent equal to log(2). A block schematic of the described DT TurboADC based on the modified Bernoulli chaotic map in Eqs. (3) is shown in FIG. 4. Since the input to the internal quantizer is compared against three thresholds ($-V_{ref}$, 0, $V_{ref}$), a 2-bit quantizer and 2-bit feedback DAC are required in this implementation. In a way, DT TurboADC represents a hybrid between the $\Delta\Sigma$ modulator and the Cyclic ADC, with the best features of both designs—oversampling, noise shaping, and simplicity from the $\Delta\Sigma$ ADC and fast half-interval searching from Cyclic ADC. However, unlike the $\Delta\Sigma$ modulator that employs a DT integrator to shape the quantization noise outside the signal band, the DT TurboADC employs an unstable filter (pole $z_p=2$ outside the unit circle), where both signal and quantization noise are shaped over aperiodic orbits. This allows it to achieve much higher R-BW products than the discrete-time $\Delta\Sigma$ ADCs. Also, unlike the Cyclic ADC, where each input signal sample is converted to digital independently of other input samples, the present state of the internal chaotic filter in TurboADC depends on the entire past of the analog input signal. In another work described in [14], an analog-to-digital converter is implemented as a discrete-time chaotic map whose initial state is set equal to an input signal sample and the map is then allowed to traverse through a total of N discrete steps generating output digital bits without further influence from the input signal. Even though the Chaotic ADC in [14] is an example of using discrete-time chaotic map to convert input analog signals to digital format, in essence, its operation is equivalent to the well-known Cyclic ADC. In both Cyclic ADCs and Chaotic ADC presented in [14], the input signal affects only one state value (the initial state of the chaotic map), while the electronic noise is affecting the state's trajectory during the entire conversion process (i.e., a random noise adds in all of the N steps required to generate N digital bits at the output) resulting in a greater sensitivity to electronic noise and largely unfavorable signal-to-noise ratio. Unlike the Chaotic ADC in [14] and Cyclic ADC, the TurboADC takes into consideration the input signal over the entire conversion process. In addition, the Cyclic and Chaotic ADC in [14] are unable to maintain constant resolution-bandwidth product when the input analog signal experiences dynamic changes in its bandwidth, as described below.

The following example emphasizes the significance of this difference between the Cyclic ADC and DT TurboADC. Let us assume that a Cyclic ADC is designed for a sampling rate of $f_s=8$ MHz with 4-bit resolution. For each of the input signal samples, the Cyclic ADC produces 4 bits after cycling through four comparisons (i.e., comparator operates at $f_c=32$ MHz), followed by resetting the internal state to a new input signal value. If we now assume that the actual analog signal applied to the Cyclic ADC is bandlimited to 1 MHz (OSR=4), the best resolution that the Cyclic ADC can achieve in this case is 5 bits after averaging four original 4-bit samples. At the same time, if the DT TurboADC operates at the same speed ($f_c=32$ MHz) and the input signal bandwidth is 1 MHz, the resolution will be 16 bits, which is a surprisingly significant improvement of 11 bits over the Cyclic ADC. Additionally, the TurboADC would require much simpler anti-aliasing filter.

Figure 5:
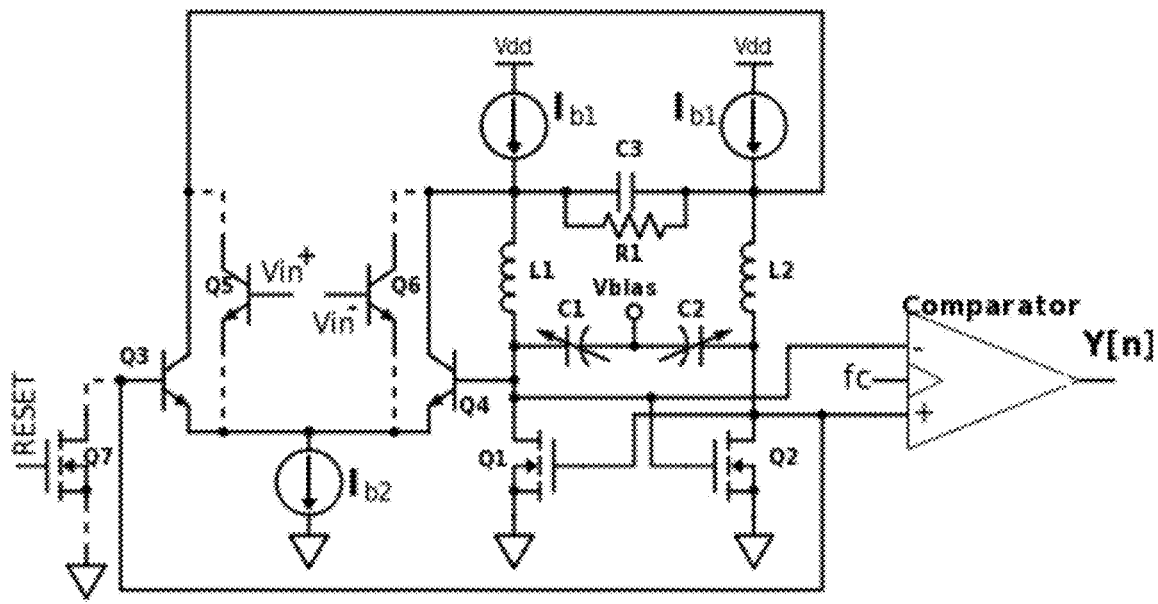
FIG. 5 illustrates one embodiment of continuous-time TurboADC implementing an -Gm LC tank chaotic oscillator.

Continuous-Time TurboADC (CT TurboADC): As described in this application, TurboADC's can be implemented with a continuous-time (CT) chaotic circuit for the purpose of achieving significantly higher conversion rates. Continuous-time electronic circuits are typically significantly faster than discrete-time counterparts, which are typically strongly frequency compensated to avoid oscillatory and overshoot behavior at their output). Examples of CT chaotic circuits are Chua circuits [15]-[17] and chaotic oscillators based on -Gm LC-tank oscillator [18]-[19]. Work in [19] demonstrates a -$G_m$ LC-tank oscillator in 0.35 um BiCMOS technology exhibiting chaotic behavior up to 5 GHz. If used in a CT TurboADC, this circuit has the potential to achieve a direct RF signal conversion up to the same bandwidth. Example applications that could benefit from the CT TurboADC are Bluetooth, mobile phones, personal networks, and other low-power radio communications as well as C-band radars for battlefield and ground surveillance, as well as missile-control. The -$G_m$ LC-tank oscillator may be able to generate chaotic behavior in the range of tens of GHz in more advanced technologies, [20]-[24] (e.g., for W-band radars). FIG. 5 depicts one embodiment of the present invention based on a negative transconductance (-$G_m$) LC tank oscillator. The cross-coupled transistor pair $Q_1$ and $Q_2$, matched inductors $L_1$ and $L_2$ and varactors $C_1$ and $C_2$ constitute a traditional LC-tank voltage-controlled oscillator (or VCO). The differential transistor pair $Q_3$ and $Q_4$ introduces non-linearity required to sustain chaotic behavior through exponential dependence of their currents to the applied base-emitter. Additional differential pair $Q_5$ and $Q_6$ introduces input analog signal $v_{in}$, into the system affecting the state's chaotic trajectory. The output from the chaotic circuit is taken from the drain terminals of the cross-coupled pair ($v_{d1}$ and $v_{d2}$) and it is fed to the comparator in FIG. 5. The comparator is triggered at the rate equal to $f_c$ producing output bit stream (e.g., y[n]=1 if $v_{d2}>v_{d1}$, and 0 otherwise).

If implemented in 65 nm CMOS technology, the design may achieve bandwidth of 5 GHz with at least 8 bits of resolution in the baseband for direct RF conversion of ISM band signals up to 2.54 GHz for use in Bluetooth, WiFi, and other low-power short-range radio communications. To the best of our knowledge, CT TurboADC's are the first attempt to extend the Cyclic and SAR ADC's, which are always implemented with discrete-time switched-capacitor (or switched-current) circuits, to the continuous-time domain for much increased conversion speed and RBW products.

Figure 6:
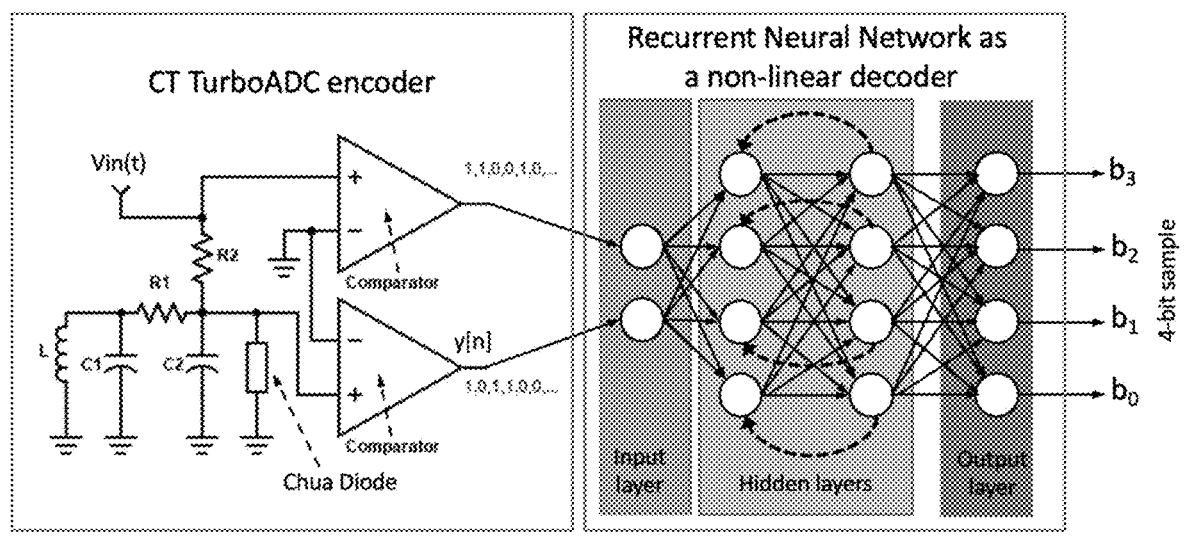
FIG. 6 illustrates another embodiment of the continuous-time TurboADC employing Chua type chaotic circuit driven by an input analog signal $V_{in}(t)$, whose state is compared by a comparator against a threshold and the resulting output (bit stream y[n]) is provided to a non-linear decoder implemented as a recurrent neural-network to generate a multi-bit digital representation of the input analog signal. The embodiment includes an optional comparator that determines the polarity of the input analog signal $V_{in}(t)$, and provides this additional information to the non-linear decoder for faster convergence. Chua diode shown in this figure is an important active component of a Chua type chaotic circuit exhibiting a piece-wise-linear current-voltage characteristic necessary to establish chaotic behavior (see [16] for details on Chua diode).

In another embodiment of the present invention, the CT Turbo ADC can be implemented by using a continuous-time chaotic circuit based on, so-called, Chua-circuit, as shown in FIG. 6. Unlike in the traditional Chua-circuit, where the internal states are independent of an external driving signal, the internal states of the chaotic circuit in this embodiment of the CT TurboADC (i.e., voltages on capacitors C1 and C2 and current through inductor L) are continuously driven by an externally applied input signal $V_{in}(t)$ through a resistive path ($R_2$). As the internal states evolve over continuous-time trajectories, while driven by an external signal $V_{in}(t)$, the voltage on the capacitor $C_2$ is compared against the threshold (e.g., zero volts) at the rate equal to $f_s$ and the result of the comparison is presented as a digital bit stream y[n].

Baseband Decoding. The single-bit stream y[n] produced by the comparator in CT TurboADC's must be decoded to produce a meaningful multi-bit representation of the input analog signal $V_{in}(t)$ in baseband. Contrary to Cyclic ADC, where there is a one-to-one correspondence between the amplitude bits of the input signal samples and information bits at the output of the comparator (e.g., $V_{in}[n] \approx V_{ref}$ ($b_0 2^{-N} + b_1 2^{(N-1)} + b_2 2^{-(N-2)} + \ldots + b_{N-1} 2^{-1}$, where $V_{in}[n]$ are the samples of a continuous-time input signal $V_{in}(t)$ sampled at time period $T_s=1/f_s$, $V_{ref}$ is the reference voltage, $b_k$ are the output information bits (total of N) with $b_0$ being the least significant bit), the CT TurboADC produces information bits that are affected by many past input signal samples. Therefore, input signal baseband samples $V_{in}[n]$ must be estimated from the comparator's single-bit output stream. Unlike the $\Delta\Sigma$ ADC where the baseband multi-bit input signal samples $V_{in}[n]$ are estimated with the help of a linear decimation filter, the CT TurboADC is a non-linear system, and so the baseband signal must be estimated with the help of non-linear estimation methods. In one embodiment of the CT TurboADC invention, the continuous-time state-space equations describing trajectory of the chaotic system's state variable(s) are discretized in time to form a discrete-time model of the CT TurboADC with the sampling frequency $f_s$. Together with the output bit stream y[n] from the CT TurboADC, the discrete-time model representing the state-space trajectory of the continuous-time chaotic circuit is applied to non-linear estimation methods as a prior knowledge for the purpose of estimating multi-bit representation of the input analog signal in baseband similar to decoding methods in Discrete-Time TurboADC's as described in [12].

For example, a non-linear estimation method could be implemented to iterate between two estimation steps as in Projections onto Convex Sets methods. The following illustrates the iterative approach to finding an estimate of the continuous-time input analog signal $V_{in}(t)$ applied to the CT TurboADC:

Step 1: Initiate the estimate $\tilde{V}_{in}^b[n]$ of length equal to M samples to zero or other appropriate initial value (where M is chosen as a decoding window so that the estimate of an input analog signal $V_{in}(t)$ is produced in blocks of length M).

Step 2: Find an estimate $\tilde{V}_{in}^a[n]$ of length M of the continuous-time input signal $V_{in}(t)$ closest to $\tilde{V}_{in}^b[n]$, e.g., in least-squares sense, such that when passed through the discrete-time state-space model of the CT Turbo ADC produces $y^a[n]$ that is the same (or similar) as the original sequence $y[n]$ generated by the comparator of the CT Turbo ADC and supplied to the decoder as prior knowledge;

Step 3: Project the estimate $\tilde{V}_{in}^a[n]$ from Step 2 to the nearest estimate $\tilde{V}_{in}^b[n]$ that satisfies prior knowledge about $V_{in}(t)$ (e.g., bandlimitation of $V_{in}(t)$ or that $V_{in}(t)$ is a linear combination of known orthogonal basis functions).

Step 4: Repeat Steps 2 and 3 until satisfactory convergence is achieved.

In another embodiment of the present invention, the non-linear decoder of the output bit stream y[n] from the CT Turbo ADC is decoded by using a recurrent neural network, as illustrated in FIG. 6, which is trained on data produced by simulating the output bit stream y[n] from the CT Turbo ADC for a broad class of signals applied to the input of the CT Turbo ADC (e.g., periodic input signals such as sinusoidal signal(s), wide-band and narrow-band random signals and combination thereof).

The new class of ADCs, termed CT TurboADC, that is described above is capable of achieving fundamental theoretical limit to the resolution-bandwidth product (or conversion capacity). The discussion above shows that a TurboADC should employ a deterministic chaotic circuit to achieve the capacity. A continuous-time implementation of TurboADC with the front-end circuit complexity similar to a simple $1^{st}$ order continuous-time $\Delta\Sigma$ modulator is also described. Ability to maintain resolution in the baseband that is proportional to the OSR (defined as the ratio between one half the sampling frequency and the input analog signal's bandwidth) surpassing all existing ADC methods, whose resolution is proportional to $\log_2(OSR)$, opening up possibilities for new data conversion applications such as high-speed direct RF signal conversion in radar, high-speed communications, and medical imaging.

Although the foregoing has been described in some detail for purposes of clarity, it will be apparent that certain changes and modifications may be made without departing from the principles thereof. It should be noted that there are many alternative ways of implementing both the processes and apparatuses described herein.

Accordingly, the present embodiments are to be considered as illustrative and not restrictive, and the body of work described herein is not to be limited to the details given herein, which may be modified within the scope and equivalents of the appended claims.

REFERENCES

[1] B. Murmann, "ADC Performance Survey 1997-2020," [Online]. Available: http://web.stanford.edu/~murmann/adcsurvey.html.

[2] C. Shannon, The Mathematical Theory of Communication, USA, IL, Urbana:Univ. Illinois Press, 1998.

[3] E. Martens et al., "A 48-dB DR 80-MHz BW 8.88-GS/s bandpass $\Delta\Sigma$ ADC for RF digitization with integrated PLL and polyphase decimation filter in 40 nm CMOS," 2011 *Symposium on VLSI Circuits*—Digest of Technical Papers, Honolulu, Hi., 2011, pp. 40-41.

[4] I. Galton and H. T. Jensen, "Delta-Sigma modulator based A/D conversion without oversampling," in *IEEE Transactions on Circuits and Systems II: Analog and Digital Signal Processing*, vol. 42, no. 12, pp. 773-784, December 1995.

[5] M. Mishali, Y. C. Eldar, O. Dounaevsky, E. Shoshan, "Xampling: Analog to digital at sub-nyquist rates", *IET Circuits Devices Syst.*, vol. 5, no. 1, pp. 8-20, January 2011.

[6] M. Marijan and Z. Ignjatovic, "Code division parallel delta-sigma A/D converter with probabilistic iterative decoding," *Proceedings of 2010 IEEE International Symposium on Circuits and Systems*, Paris, 2010, pp. 4025-4028.

[7] M. Marijan and Z. Ignjatovic, "Reconstruction of oversampled signals from the solution space of delta-sigma modulated sequences," 2011 *IEEE 54th International Midwest Symposium on Circuits and Systems (MWSCAS)*, Seoul, 2011, pp. 1-4.

[8] M. Marijan and Z. Ignjatovic, "Non-Linear Reconstruction of Delta-Sigma Modulated Signals: Randomized Surrogate Constraint Decoding Algorithm," in *IEEE Transactions on Signal Processing*, vol. 61, no. 21, pp. 5361-5373, Nov. 1, 2013.

[9] P. M. Aziz, H. V. Sorensen, J. vn der Spiegel, "An overview of sigma-delta converters," *IEEE Signal Processing Magazine*, vol. 13, no. 1, pp. 61-84, January 1996.

[10] R. H. Walden, "Analog-to-digital converter survey and analysis," in *IEEE Journal on Selected Areas in Communications*, vol. 17, no. 4, pp. 539-550, April 1999.

[11] S. Norsworthy, R. Schreier, G. Temes, G. C., and IEEE Circuit & Systems Society, Delta-Sigma data converters: theory, design, and simulation, IEEE Press, 1997.

[12] Ignjatovic Z., Zhang Y. (2019) Analog-to-Digital Converters Employing Chaotic Internal Circuits to Maximize Resolution-Bandwidth Product—Turbo ADC. In: In V., Longhini P., Palacios A. (eds) Proceedings of the 5th International Conference on Applications in Nonlinear Dynamics. Understanding Complex Systems. Springer, Cham. https://doi.org/10.1007/978-3-030-10892-2_20

[13] Z. Ignjatovic and M. Sterling, "Information-Theoretic Approach to A/D Conversion," in *IEEE Transactions on Circuits and Systems I: Regular Papers*, vol. 60, no. 9, pp. 2249-2262, September 2013.

[14] Q. Li and Q. Liu, "Simple chaos-based ADC with only one opamp," 2012 International Conference on Systems and Informatics (ICSAI2012), Yantai, 2012, pp. 824-827, doi: 10.1109/ICSAI.2012.6223136.

[15] L. O. Chua, M. Komuro, and T. Matsumoto, "The double-scroll family," IEEE Trans. Circuits Syst. 1, vol. CAS-33, pp. 1072-1118, October 1986.

[16] L. O. Chua, W. Wu, A. Huang, and G. Zhong, "A universal circuit for studying and generating chaos-part II: Strange attractors," IEEE Trans. Circuits Syst. 1, vol. 40, pp. 745-761, July 1993.

[17] M. E. Yalcin, J. A. K. Suykens and J. Vandewalle, "True random bit generation from a double-scroll attractor," in *IEEE Transactions on Circuits and Systems I: Regular Papers*, vol. 51, no. 7, pp. 1395-1404, July 2004.

[18] S. Ozoguz, A. S. Elwakil and S. Ergun, "Cross-coupled chaotic oscillators and application to random bit genera-

[19] A. S. Demirkol, V. Tavas, S. Ozoguz and A. Toker, "High frequency chaos oscillators with applications," 2007 18th *European Conference on Circuit Theory and Design*, Seville, 2007, pp. 1026-1029.

[20] Hussein, S. Vasadi, M. Soliman and J. Paramesh, "19.3 A 50-to-66 GHz 65 nm CMOS all-digital fractional-N PLL with 220 fsrms jitter," 2017 *IEEE International Solid-State Circuits Conference (ISSCC)*, San Francisco, Calif., 2017, pp. 326-327.

[21] S. Yoo, S. Choi, J. Kim, H. Yoon, Y. Lee and J. Choi, "19.2 A PVT-robust −39dBc 1 kHz-to-100 MHz integrated-phase-noise 29 GHz injection-locked frequency multiplier with a 600 µW frequency-tracking loop using the averages of phase deviations for mm-band 5G transceivers," 2017 *IEEE International Solid-State Circuits Conference (ISSCC)*, San Francisco, Calif., 2017, pp. 324-325.

[22] J. Zhang et al., "85-to-127 GHz CMOS Signal Generation Using a Quadrature VCO with Passive Coupling and Broadband Harmonic Combining for Rotational Spectroscopy," *IEEE J. Solid-State Circuits*, vol. 50, no. 6, pp. 1361-1371, June 2015.

[23] M. Adnan and E. Afshari, "A 247-to-263.5 GHz VCO with 2.6 mW Peak Output Power and 1.14% DC-to-RF Efficiency in 65 nm Bulk CMOS," *ISSCC Dig. Tech papers*, pp. 262-263, February 2014.

[24] H. Koo et al., "Design and Analysis of 239 GHz CMOS Push-Push Transformer-Based VCO with High Efficiency and Wide Tuning Range," *IEEE Trans. Circuits and Systems-I*, vol. 62, no. 7, pp. 1883-1893, July 2015.

The invention claimed is:

1. An analog-to-digital converter (ADC), comprising:
   a port for an input analog signal;
   a source configured to provide a continuous-time chaotic encoding signal that is deterministic, aperiodic above a threshold, and bounded;
   an encoder configured to encode said input analog signal with said chaotic signal to thereby produce an encoded analog signal;
   a quantizing circuit configured to quantize said encoded analog signal into a bit stream; and
   a decoder configured to apply to said bit stream a non-linear estimation related to said chaotic signal to thereby produce an output representing said input analog signal in digital form;
   wherein aperiodic above a threshold refers to lacking spectral tones above a threshold.

2. The ADC of claim 1, wherein said input analog signal is sampled at an oversampling rate (OSR) and said output signal has a resolution R proportional to OSR.

3. The ADC of claim 1, wherein the output signal has a resolution R that varies linearly with a bandwidth BW of the ADC.

4. The ADC of claim 1, wherein the chaotic encoding signal is generated by a chaotic oscillator based on negative-Gm LC-tank oscillator.

5. The ADC of claim 1, wherein the chaotic encoding signal is generated by a continuous-time chaotic Chua circuit.

6. The ADC of claim 1, wherein the decoder producing an output representing said input analog signal in digital form is implemented as a neural-network.

7. The ADC of claim 1, wherein:
   the input analog signal is sampled at an OSR;
   output signal has a resolution R that (1) is proportional to OSR; or (2) varies linearly with a bandwidth BW of the ADC;
   the chaotic encoding signal is generated by either (1) a chaotic oscillator based on negative-Gm LC-tank oscillator; or (2) a continuous-time chaotic Chua circuit; and,
   the decoder producing an output representing said input analog signal in digital form is implemented as a neural-network.

* * * * *